United States Patent
Yoshida

(10) Patent No.: US 11,915,948 B2
(45) Date of Patent: Feb. 27, 2024

(54) FLATTENING APPARATUS, ARTICLE MANUFACTURING METHOD, FLATTENING METHOD, AND IMPRINTING APPARATUS

(71) Applicant: CANON KABUSHIKI KAISHA, Tokyo (JP)

(72) Inventor: Tomohiko Yoshida, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 547 days.

(21) Appl. No.: 17/024,487

(22) Filed: Sep. 17, 2020

(65) Prior Publication Data
US 2021/0090915 A1 Mar. 25, 2021

(30) Foreign Application Priority Data

Sep. 24, 2019 (JP) ................................. 2019-173520

(51) Int. Cl.
*H01L 21/67* (2006.01)
*H01L 21/683* (2006.01)
*B81C 1/00* (2006.01)

(52) U.S. Cl.
CPC .. *H01L 21/67092* (2013.01); *H01L 21/67115* (2013.01); *H01L 21/6838* (2013.01); *B81C 1/0046* (2013.01)

(58) Field of Classification Search
None
See application file for complete search history.

(56) References Cited

U.S. PATENT DOCUMENTS 9,529,274 B2  12/2016  Ganapathisubramanian
2005/0275125 A1*  12/2005  Kawakami ............ G03F 7/0002
    264/494

* cited by examiner

*Primary Examiner* — Robert J Grun
(74) *Attorney, Agent, or Firm* — CANON U.S.A., INC. IP Division

(57) ABSTRACT

A flattening apparatus includes a mold holding unit configured to suck and hold a mold including a flat portion, a substrate holding unit holding a substrate, an exposure unit irradiating a light curing composition supplied onto the substrate with light at least via the mold to cure the composition, the composition being irradiated with the light and cured in a state where the flat portion of the mold is in contact with the composition on the substrate, a gas suction unit sucking gas from a spatial region between the mold and the mold holding unit, a gas supply unit supplying the gas to the spatial region, and a control unit controlling the gas suction unit and the gas supply unit to perform temperature adjustment processing for supplying the gas to the spatial region in a state where the mold is sucked and held onto the mold holding unit.

17 Claims, 8 Drawing Sheets

FLATTENING APPARATUS, ARTICLE MANUFACTURING METHOD, FLATTENING METHOD, AND IMPRINTING APPARATUS

BACKGROUND

Field of the Disclosure

The present disclosure relates to a flattening apparatus, an article manufacturing method, a flattening method, and an imprinting apparatus.

Description of the Related Art

As demand for finer semiconductor devices increases, a microfabrication technique for molding and curing an uncured composition on a substrate with a mold to form a patterned composition on the substrate has been attracting attention in addition to conventional photolithographic techniques. Such a technique is called imprinting technique and capable of forming a fine pattern on the order of several nanometers on the substrate.

Examples of the imprinting technique include a light curing method. An imprinting apparatus using the light curing method forms a pattern on a substrate by molding a light curing composition supplied to a shot region on the substrate with a mold, irradiating the composition with light to cure the composition, and separating the mold from the cured composition.

Such a semiconductor device manufacturing process includes flattening a substrate on which various patterns are formed. Among commonly practiced, conventional flattening techniques is flattening through formation of a coating film on the substrate using a coating apparatus such as a spin coater. However, techniques using a coating apparatus have difficulty in controlling level differences on the substrate in units of nanometers.

A technique using an imprinting technique for flattening has been known in recent years (U.S. Pat. No. 9,529,274). This technique includes applying droplets of a light curing composition onto a substrate based on level differences on the substrate, bringing a flat portion of a mold into contact with the applied composition from above, and irradiating the composition in the contacted state with ultraviolet rays to cure the composition.

However, according to the method discussed in U.S. Pat. No. 9,529,274, the irradiation light used for light curing is transmitted through the mold having the flat portion before the composition is irradiated. The mold can therefore absorb the energy of the irradiation light and increase in temperature. Since the light curing composition is characterized by changing in viscosity with temperature, a change in the composition temperature due to the mold during the flattening processing can affect the flattening accuracy.

SUMMARY

The present disclosure is directed to providing a technique advantageous in flattening a composition on a substrate through reduction of a temperature change of the composition due to a mold during flattening processing.

According to an aspect of the present invention, a flattening apparatus includes a mold holding unit configured to suck and hold a mold including a flat portion, a substrate holding unit configured to hold a substrate, an exposure unit configured to irradiate a light curing composition supplied onto the substrate with light at least via the mold to cure the composition, the composition being irradiated with the light and cured in a state where the flat portion of the mold is in contact with the composition on the substrate, a gas suction unit configured to suck gas from a spatial region between the mold and the mold holding unit, a gas supply unit configured to supply the gas to the spatial region, and a control unit configured to control the gas suction unit and the gas supply unit to perform temperature adjustment processing for supplying the gas to the spatial region in a state where the mold is sucked and held onto the mold holding unit.

According to the present invention, the mold temperature can be adjusted by supplying the gas while sucking and holding the mold. This can reduce the temperature change of the composition due to the mold during the flattening processing, whereby a technique advantageous in flattening the composition on the substrate can be provided.

Further features of the present invention will become apparent from the following description of exemplary embodiments with reference to the attached drawings.

DESCRIPTION OF THE EMBODIMENTS

Figure 1:
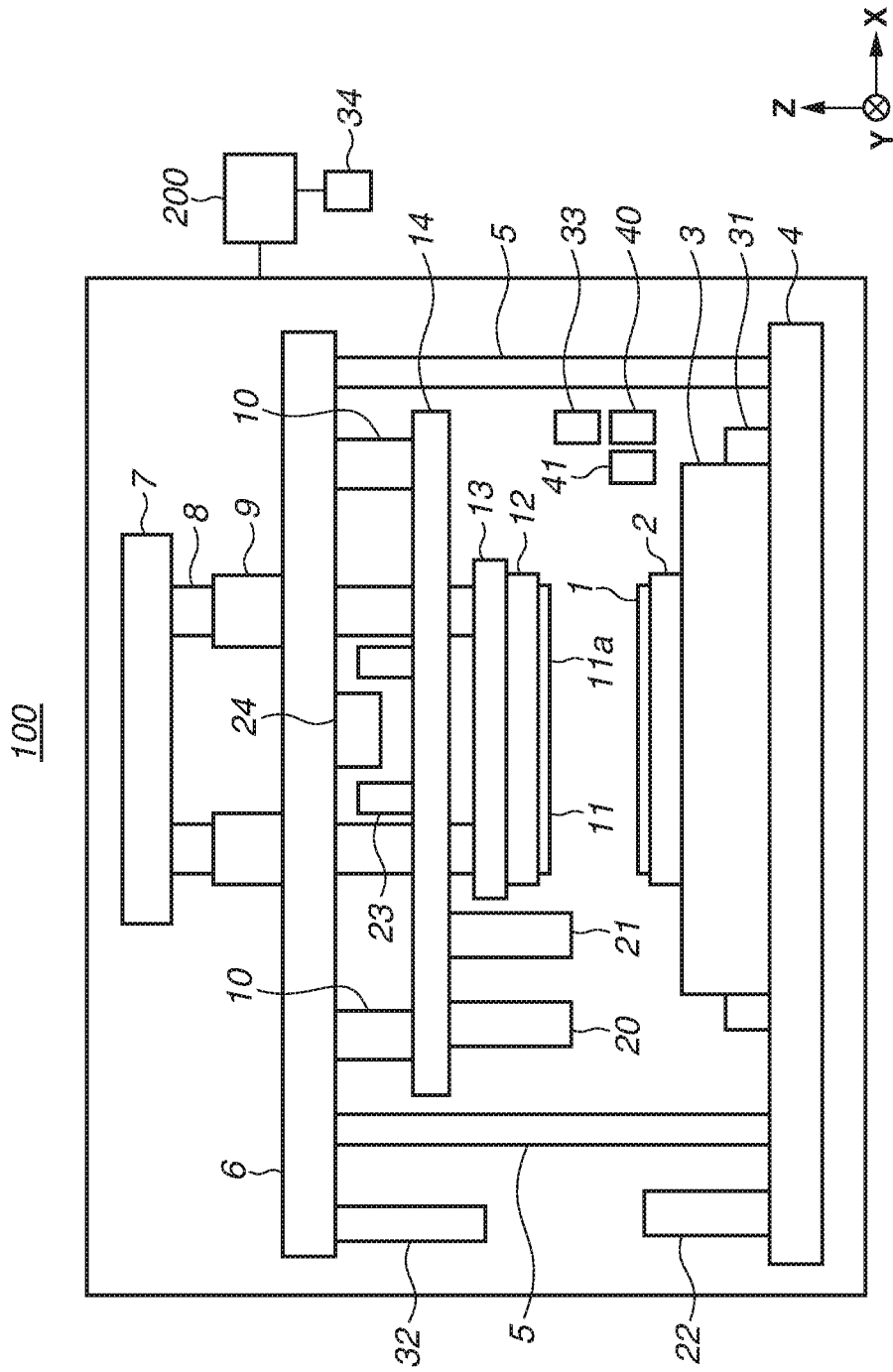
FIG. 1 is a schematic diagram illustrating a configuration of a flattening apparatus.

Preferred embodiments of the present invention will now be described in detail in accordance with the accompanying drawings. In the drawings, similar members are denoted by the same reference numerals, and a redundant description will be omitted.

First Exemplary Embodiment

A first exemplary embodiment will be described. FIG. 1 is a schematic diagram illustrating a configuration of a flattening apparatus 100. The flattening apparatus 100 is embodied as a molding apparatus for molding a composition on a substrate 1 by using a mold 11 (template). In the present exemplary embodiment, the flattening apparatus flattens the composition on the substrate 1. The flattening apparatus 100 forms a broad or local flat surface of the composition on the substrate 1 by curing the composition in a state where the component on the substrate 1 is in contact with the mold 11, and then separating the cured composition and the mold 11.

A typical base material of the substrate 1 is a silicon wafer. However, this is not restrictive. The substrate 1 may be freely selected from among conventional semiconductor device substrates including an aluminum, titanium-tungsten alloy, aluminum-silicon alloy, aluminum-copper-silicon alloy, silicon oxide, and silicon nitride substrates. A substrate on which an adhesion layer is formed by surface treatment such as silane coupling treatment, silazane treatment, and organic thin film deposition to improve adhesion to the curing composition may be used as the substrate 1. The substrate 1 typically has, but not limited to, a circular shape with a diameter of 300 mm.

The mold 11 is one made of a light transmitting material in view of a light irradiation process. Specific examples of the material constituting the mold 11 may include glass, quartz, an optically transparent resin such as polymethyl methacrylate (PMMA) and polycarbonate resin, a transparent metal deposition film, a soft film such as polydimethyl siloxane, a light curing film, and a metal film. The mold 11 can have, but not limited to, a circular shape with a diameter of 300 mm or more and less than 500 mm. The mold 11 can suitably have a thickness of, but not limited to, 0.25 mm or more and less than 2 mm.

An ultraviolet (UV) curing liquid having a light curing property can be used as the composition (flattening agent) in view of the light irradiation process. Monomeric organic liquid materials such as acrylates and methacrylates can typically be used.

The flattening apparatus 100 includes a substrate chuck 2 (substrate holding unit), a substrate stage 3, a base plate 4, columns 5, a top plate 6, a guide bar plate 7, guide bars 8, mold driving units 9, columns 10, a mold chuck 12, a head 13, and an alignment rack 14. The flattening apparatus 100 also includes a droplet supply unit 20, an off-axis alignment (OA) scope 21, a substrate transfer unit 22, alignment scopes 23, a light source 24, a stage driving unit 31, a mold transfer unit 32, and a cleaning unit 33. The flattening apparatus 100 further includes an input unit 34, a gas control unit 40, a temperature control unit 41, and a control unit 200. The substrate chuck 2 and the substrate stage 3 constitute a substrate holding unit for holding the substrate 1. The mold chuck 12 and the head 13 constitute a mold holder for holding the mold 11. An XYZ coordinate system is defined with a horizontal plane as an XY plane and a vertical direction as a Z-axis direction.

Referring to FIG. 1, the substrate (wafer) 1 is carried in from outside the flattening apparatus 100 or from a storage box containing wafers by the substrate transfer unit 22 including a transfer hand, and held on the substrate chuck 2. The substrate stage 3 is supported on the base plate 4 and driven in X- and Y-axis directions to position the substrate 1 held on the substrate chuck 2 to a predetermined position. For example, the stage driving unit 31 includes linear motors or air cylinders, and drives (moves) the substrate stage 3 in at least the X- and Y-axis directions. The stage driving unit 31 may have a function of driving the substrate stage 3 in three or more axis directions (for example, six axis directions). The stage driving unit 31 includes a rotation mechanism, and drives (rotates) the substrate chuck 2 or the substrate stage 3 to rotate about an axis parallel to the Z-axis direction.

The mold 11 is carried in from outside the flattening apparatus 100 or from a storage box containing molds by the mold transfer unit 32 including a transfer hand, and held on the mold chuck 12 (also referred to as a mold holding unit).

For example, the mold 11 has a circular or rectangular outer shape, and includes a flat portion 11a at the bottom. The flat portion 11a has such rigidity as to follow the surface shape of the substrate 1 when in contact with the composition on the substrate 1. The flat portion 11a has a size similar to or greater than that of the substrate 1. The mold chuck 12 is supported on the head 13 and has a function of correcting a tilt of the mold 11 about the Z-axis. The mold chuck 12 and the head 13 each include an opening for light (ultraviolet rays) emitted from the light source 24 via a collimator lens to pass through. A load cell for measuring the pressing force (stamping force) of the mold 11 to the composition on the substrate 1 is located on the mold chuck 12 or the head 13. If the mold chuck 12 can be made of a light transmitting material that transmits the light from the light source 24 in view of the light irradiation process, the composition can be irradiated with the light from the light source 24 via the mold chuck 12 and the mold 11 without an opening in the mold chuck 12.

The columns 5 supporting the top plate 6 are located on the base plate 4. The guide bars 8 run through the top plate 6. Each guide bar 8 is fixed to the guide bar plate 7 at one end, and to the head 13 at the other end. The mold driving unit 9 is a mechanism for driving the head 13 in the Z-axis direction via the guide bars 8 to bring the mold 11 held on the mold chuck 12 into contact with the composition on the substrate 1 and separate the mold 11 from the composition on the substrate 1. The mold driving unit 9 also has a function of driving (moving) the head 13 in the X- and Y-axis directions and a function of driving the mold chuck 12 or the head 13 to rotate about an axis parallel to the Z-axis direction.

The alignment rack 14 hangs on the top plate 6 via the columns 10. The guide bars 8 run through the alignment rack 14. A height measurement system (not illustrated) for measuring the height (flatness) of the substrate 1 held on the substrate chuck 2 by using, for example, an oblique incidence image displacement method is located on the alignment rack 14.

The OA scope 21 is supported by the alignment rack 14. The OA scope 21 is used in global alignment processing for detecting alignment marks located in a plurality of shot regions on the substrate 1 and determining the positions of the respective shot regions.

The alignment scopes 23 include optical systems and imaging systems for observing reference marks on the substrate stage 3 and alignment marks on the mold 11. If the mold 11 has no alignment mark, the alignment scopes 23 may be omitted. The alignment scopes 23 are used for alignment purposes to measure relative positions of the reference marks on the substrate stage 3 and the alignment marks on the mold 11 and correct differences in position. The mold 11 and the substrate 1 can be aligned relative to each other by determining a positional relationship between the mold 11 and the substrate stage 3 by the alignment scopes 23 and determining a positional relationship between the substrate stage 3 and the substrate 1 by the OA scope 21.

The droplet supply unit 20 includes a dispenser having a discharge port (nozzle) or discharge ports (nozzles) for discharging an uncured (liquid) composition onto the substrate 1, and applies and arranges (supplies) droplets of the composition onto the substrate 1. The droplet supply unit 20 can supply micro-volume droplets of the composition onto the substrate 1, for example, by using a piezo-jet method or microsolenoid method. The number of discharge ports in the droplet supply unit 20 is not limited in particular. The droplet supply unit 20 may include a single discharge port (single nozzle) or more than 100 discharge ports. In other words, the droplet supply unit 20 may include a linear nozzle array or a combination of a plurality of linear nozzle arrays.

The cleaning unit 33 cleans the mold 11 in a state where the mold 11 is held on the mold chuck 12. The cleaning unit 33 removes the composition adhering to the mold 11, or the flat portion 11a in particular, by separating the mold 11 from the cured composition on the substrate 1. For example, the cleaning unit 33 may wipe the adhering composition off the mold 11. The cleaning unit 33 may remove the composition adhering to the mold 11 by using UV irradiation, wet cleaning, or plasma cleaning.

The gas control unit 40 is used to hold the mold 11 onto the mold holding unit 12 by vacuum suction, and control supply of cooling gas to a spatial region between the mold chuck 12 and the mold 11. Specifically, the gas control unit 40 includes a vacuum suction pump 53, a gas supply unit 54, a flow rate adjustment mechanism 51 for vacuum suction, and a flow rate adjustment mechanism 52 for cooling gas supply (see FIG. 4). The temperature control unit 41 performs temperature control on the cooling gas supplied to the mold holding unit 12.

The control unit 200 includes a processing unit such as a central processing unit (CPU), other processors, and a field-programmable gate array (FPGA), and a storage unit such as a memory. The control unit 200 functions as a processing unit for controlling the entire flattening apparatus 100 and controlling the components of the flattening apparatus 100 in a centralized manner to perform flattening processing and temperature adjustment processing. As employed herein, the flattening processing refers to processing for flattening the composition by bringing the flat portion 11a of the mold 11 into contact with the composition on the substrate 1 so that the flat portion 11a follows the surface shape of the substrate 1. The temperature adjustment processing refers to processing for adjusting the temperature of the mold 11 by using the gas control unit 40 and the temperature control unit 41. The flattening processing is typically performed by lots, i.e., on each of a plurality of substrates included in the same lot.

Figure 2A:
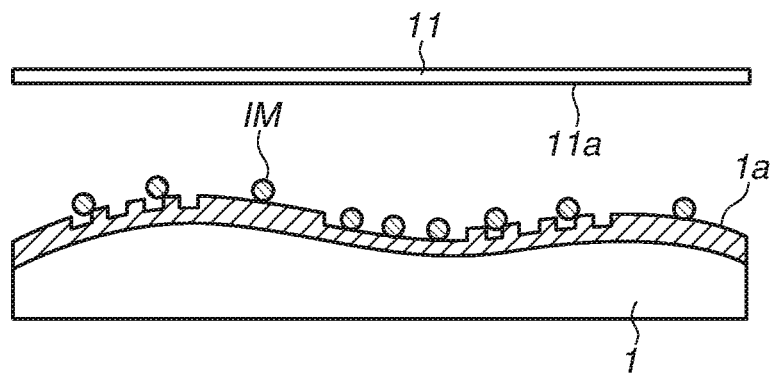
FIGS. 2A, 2B and 2C are diagrams illustrating the outline of flattening processing.
Figure 2B:
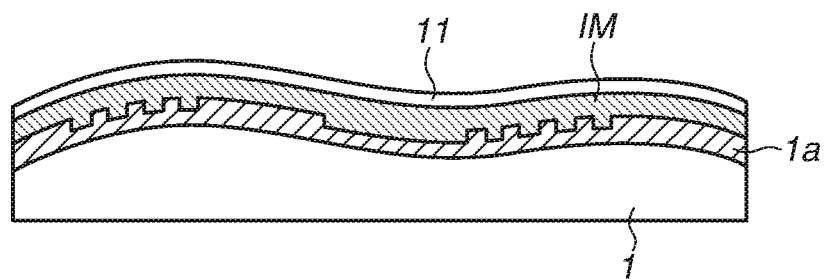
Figure 2C:
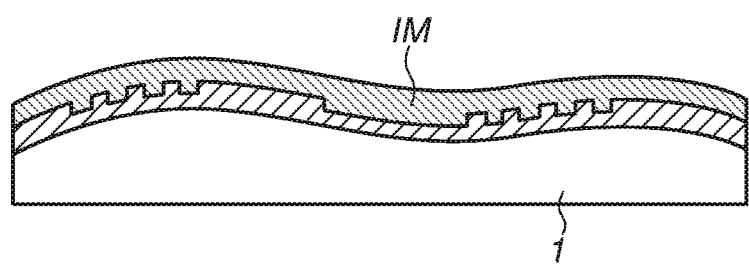

Next, the temperature adjustment processing and the flattening processing will be outlined with reference to FIGS. 2A to 2C. While processing for applying droplets of the composition to the entire surface of the substrate 1 and bringing the mold 11 into contact with the composition to flatten the composition will be described here, the composition may be flattened by bringing the mold 11 into contact with the composition on a partial region of the substrate 1.

As illustrated in FIG. 2A, a plurality of droplets of a composition IM is initially dropped from the droplet supply unit 20 onto the substrate 1 where a base pattern is formed. FIG. 2A illustrates a state where the composition IM is supplied onto the substrate 1 before contact of the mold 11. Next, as illustrated in FIG. 2B, the flat portion 11a of the mold 11 is brought into contact with the composition IM on the substrate 1. FIG. 2B illustrates a state where the flat portion 11a of the mold 11 is in contact with the entire composition IM on the substrate 1, and the flat portion 11a of the mold 11 follows the surface shape of the substrate 1. In the state illustrated in FIG. 2B, the composition IM on the substrate 1 is irradiated with light from the light source 24 (exposure unit) at least via the mold 11, whereby the composition IM is cured. Next, as illustrated in FIG. 2C, the mold 11 is separated from the cured composition IM on the substrate 1. This can form a flattening layer of the composition IM with a uniform thickness over the entire surface of the substrate 1. FIG. 2C illustrates a state where the flattening layer of the composition IM is formed on the substrate 1.

In the composition curing treatment, the composition IM is irradiated with the light from the light source 24 through the mold 11 made of a material transmitting the light as described above. Since the transmittance of the material of the mold 11 is not 100%, some of the energy is absorbed to increase the temperature of the mold 11. In addition, the composition IM generates heat when absorbing light to polymerize and cure. This further increases the temperature of the mold 11 contacting the composition IM. Consequently, if the flattening processing is repeated on a plurality of substrates constituting a lot, the temperature of the mold 11 becomes higher than that of the ambient atmosphere.

Meanwhile, the composition IM changes in viscosity as the use temperature changes. The contact of the mold 11 hotter than the temperature of the ambient atmosphere thermally causes a change in viscosity, causing variations in the thickness and surface shape of the composition IM constituting the flattening layer from one wafer to another and variations within a single wafer surface. The accuracy of the flattening processing can thus be lowered.

To solve such an issue, the flattening apparatus according to the present exemplary embodiment adjusts the temperature of the mold 11 by performing temperature adjustment processing for cooling the mold 11 contacting the composition IM with the cooling gas. The flattening apparatus thereby controls the flattening processing with minimum changes in the viscosity of the composition IM.

Figure 3A:
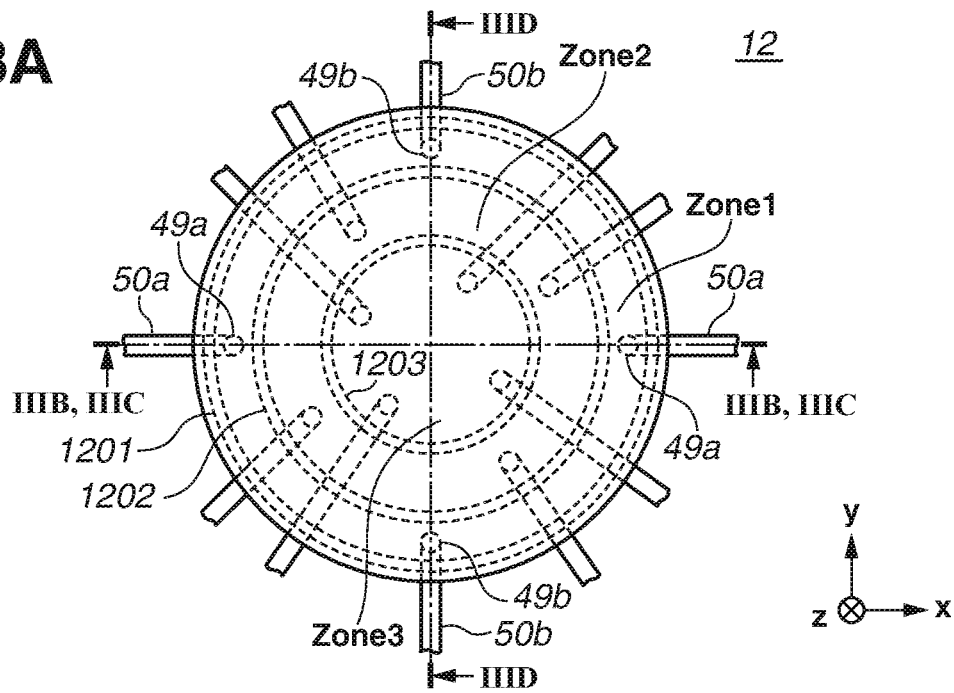
FIG. 3A is a plan view of a mold holding unit.
Figure 3B:
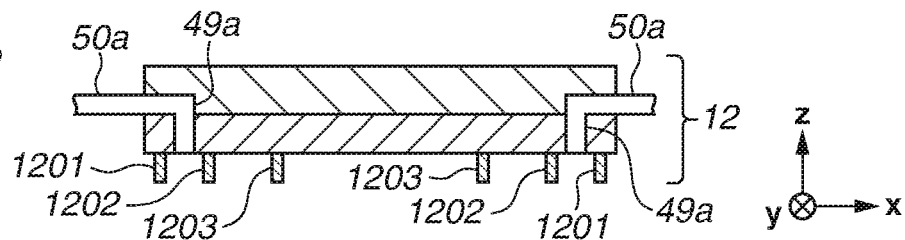
FIG. 3B is a sectional view of the mold holding unit, taken along the line IIIB-IIIB.
Figure 3C:
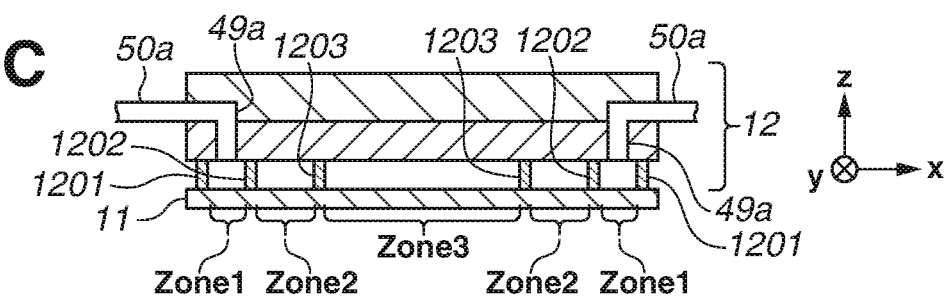
FIG. 3C is a sectional view of the mold holding unit holding a mold, taken along the line IIIC-IIIC.
Figure 3D:
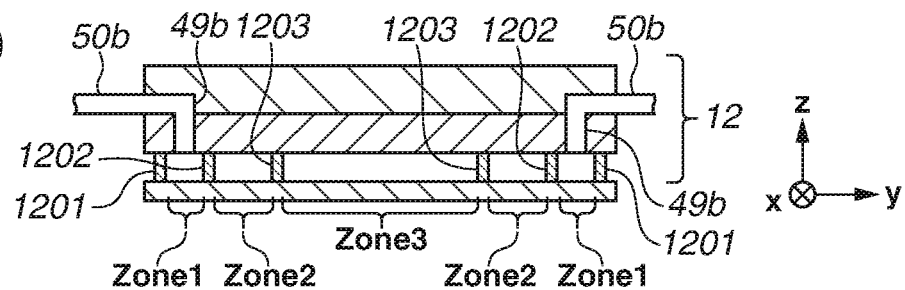
FIG. 3D is a sectional view of the mold holding unit holding the mold, taken along the line IIID-IIID.
Figure 4:
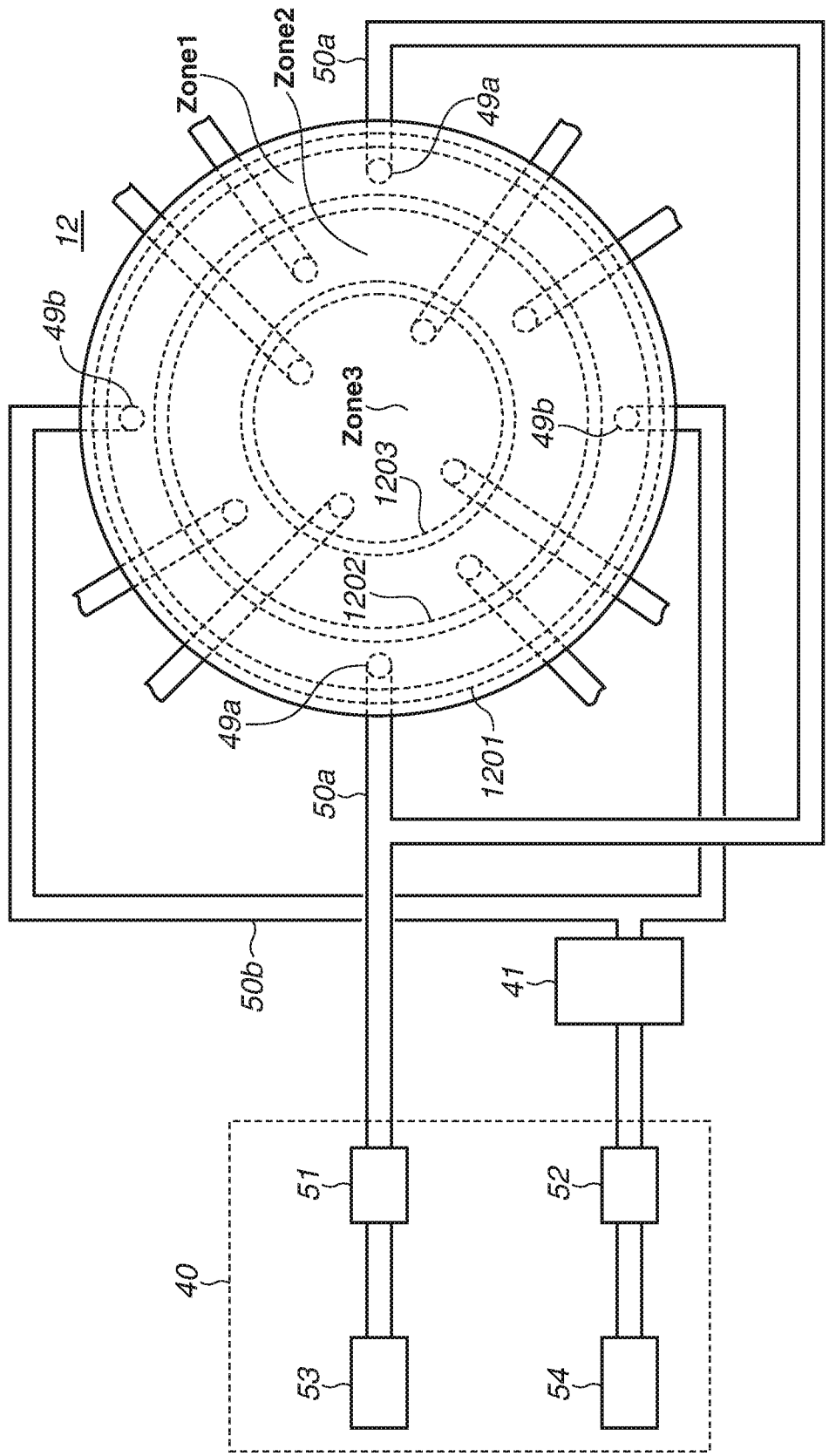
FIG. 4 is a schematic diagram illustrating connections of the mold holding unit with a gas supply unit and a vacuum suction pump according to a first exemplary embodiment.

Configuration used for the temperature adjustment processing of the flattening apparatus 100 on the mold 11 according to the present exemplary embodiment will be described with reference to FIGS. 3A to 3D and 4. FIG. 3A is a plan view of the mold holding unit 12 of the flattening apparatus 100 according to the present exemplary embodiment. FIG. 3B is a sectional view of the mold holding unit 12, taken along the line IIIB-IIIB. FIG. 3C is a sectional view of the mold holding unit 12 holding the mold 11, taken along the line IIIC-IIIC. FIG. 3D is a sectional view of the mold holding unit 12 holding the mold 11, taken along the line IIID-IIID. FIG. 4 is a schematic diagram illustrating connections of through holes 49 in the mold holding unit 12 with the vacuum suction pump 53 and the gas supply unit 54 according to the present exemplary embodiment.

A plurality of annular protrusions (ribs) 1201, 1202, and 1203 is concentrically located on the surface of the mold holding unit 12 where the mold 11 is sucked to. The protrusions 1201, 1202, and 1203 contact the mold 11, whereby suction regions constituting a plurality of spatial regions are concentrically formed between the mold holding unit 12 and the mold 11. More specifically, the spatial regions between the mold holding unit 12 and the mold 11 are partitioned by the plurality of protrusions 1201, 1202, and 1203, whereby a region Zone3, a region Zone2, and a region Zone1 are formed next to each other in order from the center. The mold holding unit 12 includes at least two through holes 49a and 49b in each region. One of the through holes, 49a, is connected to piping 50a leading to the gas supply unit 54. The other through hole 49b is connected to piping 50b leading to the vacuum suction pump 53 (vacuum source). Each spatial region is thereby configured to be capable of both vacuum suction and supply of the cooling gas at the same time. While in the example of FIG. 3A the mold holding unit 12 is described to be partitioned into three regions, the number of partitions may be changed as appropriate. The sizes of the regions may also be changed as appropriate.

Next, configuration for performing the temperature adjustment processing according to the present exemplary embodiment will be described with reference to FIG. 4. FIG. 4 illustrates only the connections of the through holes 49 in the region Zone1 of the mold holding unit 12 illustrated in FIG. 3A with the vacuum suction pump 53 and the gas supply unit 54. Although omitted in FIG. 4, connections for the regions Zone2 and Zone3 can be similarly established. The piping 50a connected to the through holes 49a is connected to the vacuum suction pump 53 used to suck the spatial regions by vacuum to hold the mold 11. The piping 50b connected to the through holes 49b is connected to the gas supply unit 54 that can supply the cooling gas to the spatial regions. Examples of the cooling gas supplied from the gas supply unit 54 may include clean dry air, nitrogen gas, argon gas, and helium gas.

The flow rate adjustment mechanism 51 capable of cutting off the suction pressure from the vacuum suction pump 53 or adjusting the flow rate is located on the piping 50a. The flow rate adjustment mechanism 52 for cutting off or adjusting the flow rate of the cooling gas from the gas supply unit 54 is located on the piping 50b. Solenoids and regulators, or mass flow controllers, can be used as the flow rate adjustment mechanisms 51 and 52. In other words, in the present exemplary embodiment, the vacuum suction pump 53 and the flow rate adjustment mechanism 51 constitute a gas suction unit that sucks gas from the spatial regions. The gas control unit 40 can control the suction of the gas from the space region by controlling at least either one of the vacuum suction pump 53 and the flow rate adjustment mechanism 51. Moreover, the gas supply unit 54 and the flow rate adjustment mechanism 52 constitute a gas supply unit that supplies gas to the spatial regions. The gas control unit 40 can control the supply of the cooling gas to the spatial regions by controlling at least either one of the gas supply unit 54 and the flow rate adjustment mechanism 52. In the flowchart described below, the flow rate adjustment mechanisms 51 and 52 will be described to be used for control purposes. However, the flow rate adjustment mechanisms 51 and 52 may be omitted if the suction and supply of gas can be controlled by the vacuum suction pump 53 and the gas supply unit 54.

The temperature control unit 41 for adjusting the temperature of the cooling gas flowing through the piping 50b is also located on the piping 50b. Since the gas used as the cooling gas has low specific heat compared to liquid, the temperature control unit 41 is desirably located as close to the cooling target (mold 11) as possible. The temperature control unit 41 is desirably located at least closer to the through holes 49b than to the flow rate adjustment mechanism 52. Locating the piping 50a and 50b next to each other can reduce the layout area and improve the vacuum suction flow and the gas supply flow.

The temperature control unit 41 controls the temperature of the cooling gas so that the mold 11 can be cooled to the temperature of the ambient atmosphere where the flattening apparatus 100 is located. To prevent frosting inside the flattening apparatus 100, the temperature of the cooling gas can be controlled to a temperature equivalent to or 3° C. to 7° C. lower than that of the ambient atmosphere. Note that the temperature control unit 41 is not an indispensable component, and may be omitted if the temperature of the cooling gas supplied to the mold holding unit 12 is near that of the ambient atmosphere where the flattening apparatus 100 is located.

Figure 5:
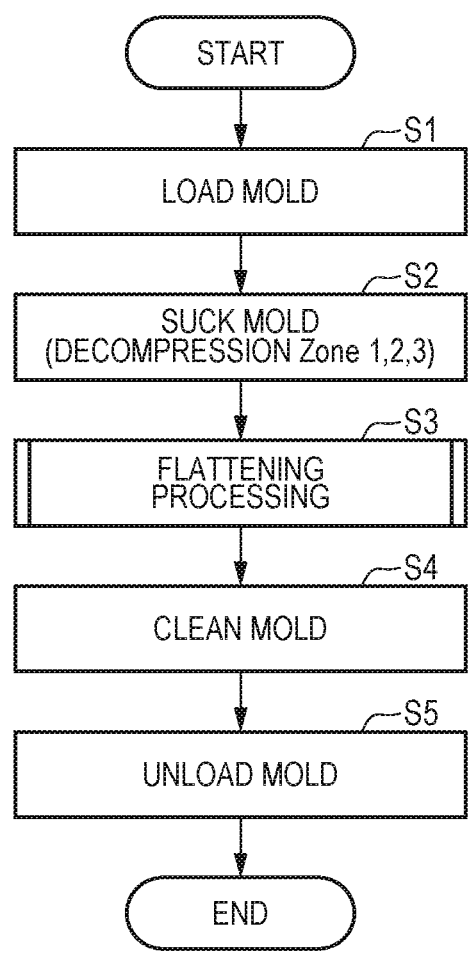
FIG. 5 is a flowchart illustrating a series of processes of the flattening apparatus, including loading and unloading of the mold into/from the flattening apparatus.
Figure 6:
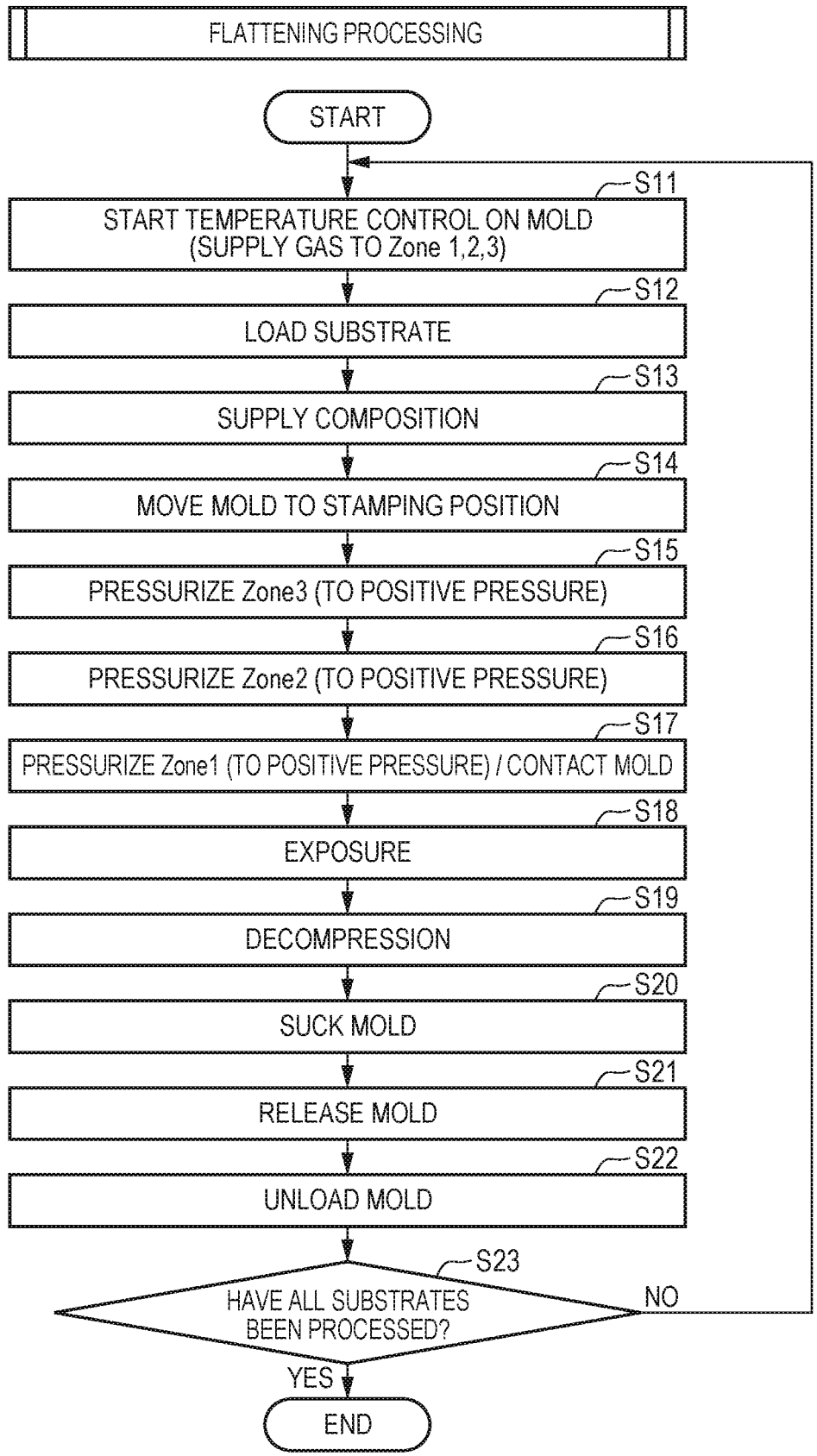
FIG. 6 is a flowchart illustrating flattening processing illustrated in step S3 of FIG. 5.
Figure 7:
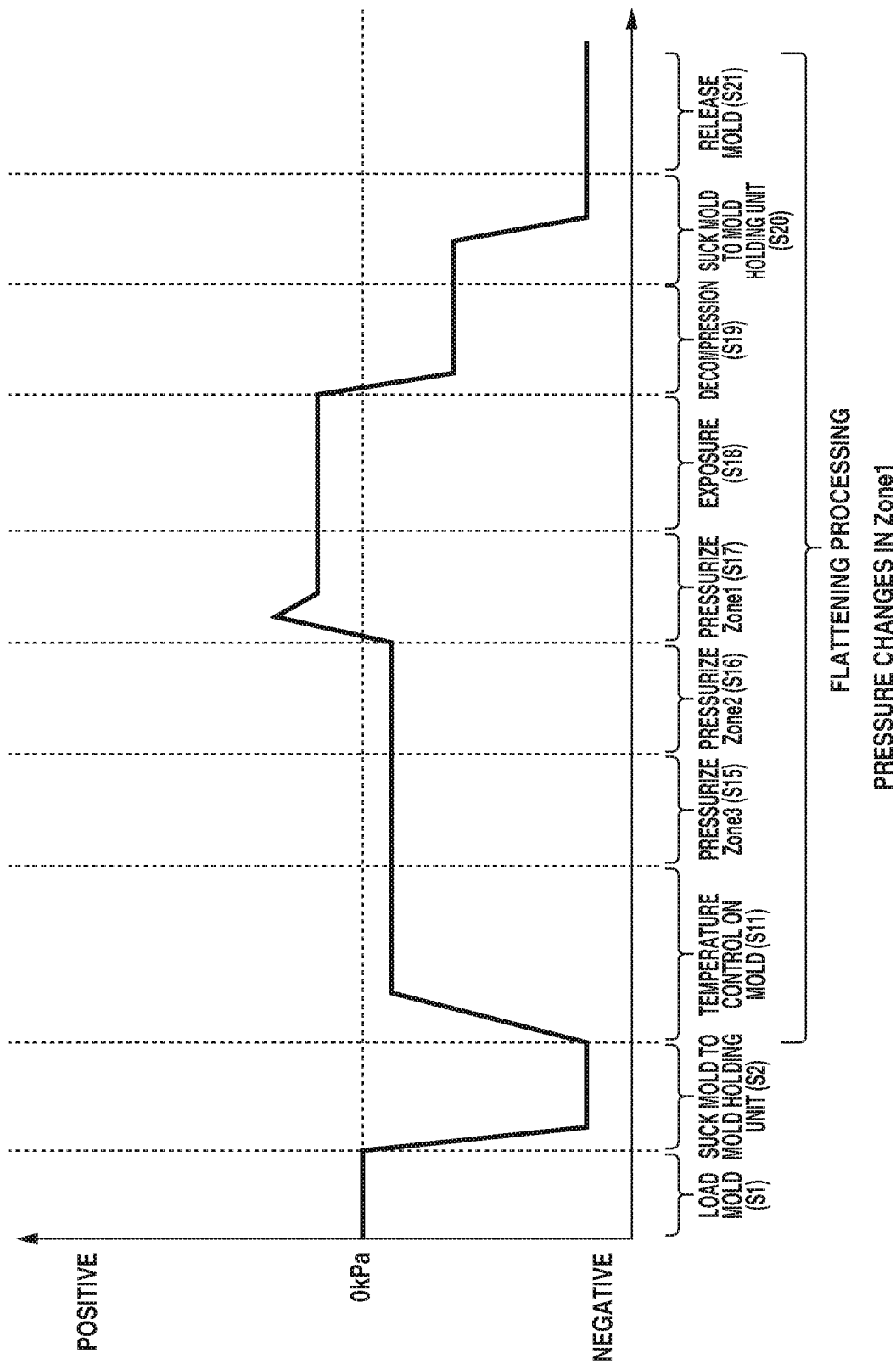
FIG. 7 is a chart illustrating pressure changes at a point corresponding to a region Zone1.

Next, a procedure where the flattening apparatus 100 according to the present exemplary embodiment performs flattening processing with mold temperature adjustment will be described with reference to FIGS. 5 and 6. FIG. 5 is a flowchart illustrating a series of processes of the flattening apparatus 100, including loading and unloading of the mold 11 into/from the flattening apparatus 100. FIG. 6 is a flowchart illustrating flattening processing illustrated in step S3 of FIG. 5. As described above, the temperature adjustment processing and the flattening processing are performed by the control unit 200 controlling the components of the flattening apparatus 100 in a centralized manner FIG. 7 illustrates pressure changes inside the region Zone1 during each process.

In step S1, the control unit 200 controls the mold transfer unit 32 to carry the mold 11 into the mold holding unit 12 in the flattening apparatus 100 (load).

In step S2, the control unit 200 makes the gas control unit 40 control the flow rate adjustment mechanism 51 so that the vacuum suction pump 53 generates suction pressure in the spatial regions between the mold 11 and the mold holding unit 12. The mold 11 is thereby sucked to the mold holding unit 12 by vacuum. Specifically, the gas control unit 40 opens the passage of the piping 50a by the flow rate adjustment mechanism 51 and keeps the passage of the piping 50b closed by the flow rate adjustment mechanism 52. Although not illustrated in the diagram, the order of vacuum suction can be controlled so that the region Zone3 is the first and the region Zone1 is the last to be sucked. Performing vacuum suction in such order enables the mold 11 to be held on the mold holding unit 12 without deflection.

In step S3, the control unit 200 performs flattening processing to be described below with reference to FIG. 6.

In step S4, the control unit 200 cleans the mold 11 held on the mold holding unit 12 by using the cleaning unit 33 (in other words, remove the composition adhering to the flat portion 11a of the mold 11).

In step S5, the control unit 200 controls the mold transfer unit 32 to carry the mold 11 out of the mold holding unit 12 in the flattening apparatus 100 (unload).

Next, processes in step S3 will be described with reference to FIG. 6. In step S11, the control unit 200 starts temperature control on the mold 11. Specifically, the gas control unit 40 controls the flow rate adjustment mechanisms 51 and 52 so that the vacuum suction pump 53 sucks the spatial regions between the mold 11 and the mold holding unit 12 to maintain the mold 11 sucked and held onto the mold holding unit 12 while the gas supply unit 54 supplies the cooling gas to the spatial regions. Here, the gas control unit 40 controls the pressures in the respective spatial regions Zone1, Zone2, and Zone3 to a negative pressure such that the mold 11 can be held and prevented from falling from the mold holding unit 12. By maintaining such a state for a certain time, the mold 11 can be cooled to a desired cooling state. Since the mold temperature tends to increase with the number of substrates processed, the maintaining time may be adjusted to increase with the number of substrates processed. Note that this process does not need to be completed before step S12 and can be completed by a start of pressure treatment in step S15. In such a manner, the temperature of the mold 11 can be efficiently adjusted by supplying the cooling gas while maintaining the suction.

In step S12, the control unit 200 makes the substrate transfer unit 22 load a substrate 1 to be processed into the flattening apparatus 100, and make the substrate chuck 2 hold the substrate 1.

In step S13, the control unit 200 makes the droplet supply unit 20 supply the composition onto the substrate 1 loaded in step S12.

In step S14, the control unit 200 makes the mold driving unit 9 drive the head 13 in the Z-axis direction to move the mold 11 to a composition stamping position on the substrate 1.

In steps S15 to S17, the control unit 200 makes the gas control unit 40 control the flow rate adjustment mechanisms 51 and 52 to increase the amount of gas supplied from the gas supply unit 54 and decrease the suction pressure from the vacuum suction pump 53. The spatial regions between the mold 11 and the mold holding unit 12 are thereby pressurized. Here, the pressures are changed from negative to positive in order from the region Zone3 in the center of the mold 11 so that the mold 11 is deformed into a convex shape. The mold 11 can thus be separated from the mold holding unit 12 in the center first to make contact with the composition, so that the mold 11 can contact the composition without deflection. In the example illustrated in FIG. 7, the temperature control on the region Zone1 is performed with the same supply amount of the cooling gas from step S15 to step S17 where the mold 11 is pressurized into the convex shape. However, the suction of the mold 11 can fail to be maintained depending on the area of the region Zone1. In such a case, the supply amount of the cooling gas can be adjusted so that the negative pressure in steps S15 and S16 prevents separation of the mold 11 from the mold holding unit 12 and then the mold 11 is released at the timing of step S17.

In step S18, the control unit 200 irradiates the composition with the light from the light source 24 (exposure unit) at least via the mold 11 to cure the composition in the state where the flat portion 11a of the mold 11 is in contact with the composition. If the mold chuck 12 is made of a light transmitting material (transparent material) like the mold 11, the control unit 200 irradiates the composition with the light from the light source 24 via the mold chuck 12 and the mold 11 to cure the composition. During step S18, the control unit 200 may make the gas control unit 40 continue supplying the cooling gas from the gas supply unit 54 to cool the mold 11 separated from the mold holding unit 12. This can reduce the temperature increase of the mold 11 during exposure.

In step S19, the control unit 200 controls the gas control unit 40 to stop supplying the cooling gas from the gas supply unit 54 and increase the suction pressure from the vacuum suction pump 53 to decompress the gap between the mold 11 and the mold holding unit 12. In step S20, the control unit 200 makes the mold driving unit 9 drive the head 13 downward in the Z-axis direction to suck the mold 11 to the mold holding unit 12 by vacuum.

In step S21, the control unit 200 makes the mold driving unit 9 to drive the head 13 upward in the Z-axis direction with the mold 11 sucked to the mold holding unit 12 by vacuum, whereby the mold 11 is released from the cured composition on the substrate 1.

In step S22, the control unit 200 moves the processed substrate 1 to an unloading position and makes the substrate transfer unit 22 unload the substrate 1. In step S23, the control unit 200 determines whether there is still a substrate 1 to be subjected to the flattening processing. If all the substrates 1 have not been processed (NO in step S23), the processing returns to step S11 and the control unit 200 continues processing. On the other hand, if all the substrates 1 have been processed (YES in step S23), the flattening processing is completed.

Note that after the mold 11 is held on the mold holding unit 12 in step S20, the control unit 200 may start the temperature control of step S11 on the mold 11 even before the unloading processing of the substrate 1 and the loading processing of the next substrate 1 are completed.

As described above, in the present exemplary embodiment, the temperature change of the mold 11 is reduced by supplying the cooling gas to cool the mold 11 before the mold 11 is brought into contact with the composition for the flattening processing. This can reduce changes in the viscosity of the composition when the mold 11 is brought into contact with the composition to flatten the composition on the substrate 1. The flattening accuracy can thus be maintained with high reliability.

Second Exemplary Embodiment

In a second exemplary embodiment, another connection example of through holes in a mold holding unit 12 with a gas supply unit and a vacuum suction pump different from the first exemplary embodiment will be described. The rest of the configuration is similar to that of the first exemplary embodiment, and a description thereof will thus be omitted.

Figure 8:
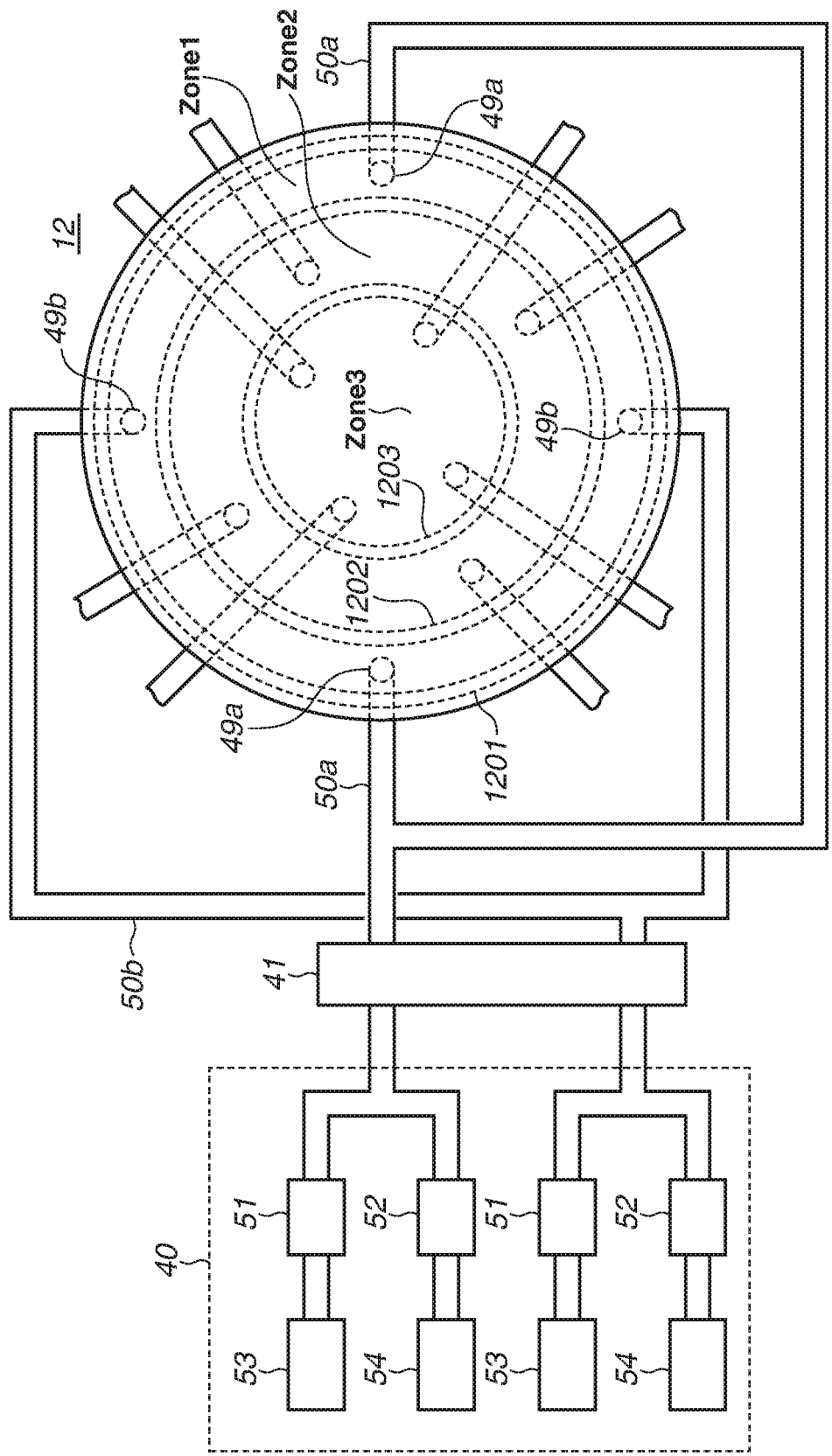
FIG. 8 is a schematic diagram illustrating connections of a mold holding unit with gas supply units and vacuum suction pumps according to a second exemplary embodiment.

FIG. 8 is a schematic diagram illustrating connections of the through holes in the mold chuck 12 with gas supply units 54 and vacuum suction pumps 53 according to the present exemplary embodiment. In the first exemplary embodiment, the piping 50a is connected only to the vacuum suction pump 53, and the piping 50b only to the gas supply unit 54. In the present exemplary embodiment, both the piping 50a and the piping 50b are connected to a vacuum suction pump 53 and a gas supply unit 54.

With such a configuration, the gas control unit 40 can control switching between when the piping 50a is used for gas supply and the piping 50b for vacuum suction and when the piping 50b is used for gas supply and the piping 50a for vacuum suction. In other words, in processing a plurality of substrates 1 in a lot, the flows of the cooling gas in the spatial regions can be switched by switching the directions of the cooling gas substrate by substrate, whereby the mold 11 can be more efficiently cooled. This can reduce the occurrence of changes in the viscosity of the composition when the mold 11 is brought into contact with the composition to flatten the composition on the substrate 1. The flattening accuracy can thus be maintained with high reliability.

In the first and second exemplary embodiments, the plurality of spatial regions is described to be subjected to the same temperature adjustment control. However, since the mold 11 tends to heat up in the center, the spatial regions may be separately controlled to facilitate cooling. For example, the gas flow rate in the center region Zone3 may be made higher than that in the other regions Zone2 and Zone1. The temperature of the cooling gas in the center region Zone3 lower than that in the other regions Zone2 and Zone1.

In the first and second exemplary embodiments, the mold 11 is cleaned after the end of the flattening processing on all the substrates 1 included in the same lot and before the unloading of the mold 11 from the flattening apparatus 100. However, this is not restrictive. For example, even when the flattening processing on all the substrates 1 included in the same lot is not ended, the mold 11 may be cleaned when the number of times the mold 11 is driven relative to a substrate 1 to be processed reaches a predetermined number. If the flattening apparatus 100 includes a detection unit for detecting the state of adhesion of an imprint material (composition) to the flat portion 11a of the mold 11, the mold 11 may be cleaned based on the detection result of the detection unit.

While the first and second exemplary embodiments have dealt with a light curing method, the first and second exemplary embodiments are also applicable to a heat curing method. While the first and second exemplary embodiments have been described by using a flattening apparatus that performs flattening processing using a mold having a flattening region, the first and second exemplary embodiments are also applicable to an imprinting apparatus that performs imprint treatment by bringing a mold having a patterned region into contact with a composition on a substrate. In such a case, similar effects can be obtained by applying the first and second exemplary embodiments to an imprinting apparatus that performs batch imprint treatment on an entire wafer surface, like bringing a mold having substantially the same size as that of the substrate (wafer) into contact with the composition on the substrate and exposing the composition on the substrate.

(Article Manufacturing Method)

Next, an article (such as a semiconductor integrated circuit (IC) element, a liquid crystal display element, a color filter, and microelectromechanical systems (MEMS)) manufacturing method using the foregoing flattening apparatus or flattening method will be described. This manufacturing method includes a process for bringing a mold into contact with a composition on a substrate (wafer or glass substrate) to flatten the composition, curing the composition, and releasing the mold from the composition by using the foregoing flattening apparatus. The manufacturing method further includes a process for performing processing, such as patterning using a lithographic apparatus, on the substrate including the flattened composition. The processed substrate is subjected to other conventional treatment processes, whereby articles are manufactured. The other conventional treatment processes include etching, resist stripping, dicing, bonding, and packaging. According to this manufacturing method, articles of higher quality than heretofore can be manufactured.

The exemplary embodiments of the present invention have been described above. It will be understood that the present invention is not limited to such exemplary embodiments, and various changes and modifications may be made without departing from the gist of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-173520, filed Sep. 24, 2019, which is hereby incorporated by reference herein in its entirety.

What is claimed is:

1. A flattening apparatus comprising:
   a mold holding unit configured to suck and hold a mold, the mold including a flat portion;
   a substrate holding unit configured to hold a substrate;
   an exposure unit configured to irradiate a light curing composition supplied onto the substrate with light at least via the mold to cure the composition, the composition being irradiated with the light and cured in a state where the flat portion of the mold is in contact with the composition on the substrate;
   a gas suction unit configured to suck gas from a spatial region between the mold and the mold holding unit;
   a gas supply unit configured to supply the gas to the spatial region; and
   a control unit configured to control the gas suction unit and the gas supply unit to perform temperature adjustment processing for supplying the gas to the spatial region in a state where the mold is sucked and held onto the mold holding unit,
   wherein the control unit is configured to perform control such that processing of irradiating the composition with the light to cure the composition in a state where the mold held on the mold holding unit is brought into contact with the composition on the substrate is executed with the mold separated from the mold holding unit.

2. The flattening apparatus according to claim 1, wherein the control unit is configured to perform control such that processing of irradiating the composition with the light to cure the composition in a state where the mold held on the mold holding unit is brought into contact with the composition on the substrate is executed after the temperature adjustment processing is started.

3. The flattening apparatus according to claim 1, wherein the control unit is configured to supply the gas from the gas supply unit even after the mold is separated from the mold holding unit.

4. The flattening apparatus according to claim 1,
   wherein the spatial region is partitioned into a plurality of concentric regions, and
   wherein the gas supply unit and the gas suction unit are located to simultaneously suck and supply the gas from/to each of the plurality of regions.

5. The flattening apparatus according to claim 1, wherein the gas suction unit performs the gas suction and the gas supply unit performs the gas supply via a plurality of through holes in the mold holding unit.

6. The flattening apparatus according to claim 5, wherein a part of the plurality of through holes is used to suck the gas, and another part of the plurality of through holes is used to supply the gas.

7. The flattening apparatus according to claim 1, further comprising a temperature control unit configured to control temperature of the gas supplied from the gas supply unit.

8. The flattening apparatus according to claim 1, wherein the spatial region is formed by an annular protrusion on the mold holding unit contacting the mold.

9. The flattening apparatus according to claim 1, wherein the mold is made of a light transmitting material that transmits the light from the exposure unit.

10. The flattening apparatus according to claim 1,
    wherein the mold holding unit is made of a light transmitting material that transmits the light from the exposure unit, and
    wherein the exposure unit is configured to irradiate the light curing composition supplied onto the substrate with the light via the mold and the mold holding unit.

11. An article manufacturing method comprising:
    flattening a substrate by using a flattening apparatus including
      a mold holding unit configured to suck and hold a mold including a flat portion,
      a substrate holding unit configured to hold the substrate,
      an exposure unit configured to irradiate a light curing composition supplied onto the substrate with light at least via the mold to cure the composition, the composition being irradiated with the light and cured in a state where the flat portion of the mold is in contact with the composition on the substrate, a gas suction unit configured to suck gas from a spatial region between the mold and the mold holding unit, a gas supply unit configured to supply the gas to the spatial region, and a control unit configured to control the gas suction unit and the gas supply unit to perform temperature adjustment processing for supplying the gas to the spatial region in state where the mold is sucked and held onto the mold holding unit; and processing the flattened substrate, the processed substrate being manufactured into an article, wherein the control unit is configured to perform control such that processing of irradiating the composition with the light to cure the composition in a state where the mold held on the mold holding unit is brought into contact with the composition on the substrate is executed with the mold separated from the mold holding unit.

12. A flattening method of a flattening apparatus including a mold holding unit configured to suck and hold a mold including a flat portion and a substrate holding unit configured to hold a substrate, the flattening apparatus being configured to irradiate a light curing composition supplied onto the substrate with light to cure the composition in a state where the flat portion of the mold is in contact with the composition on the substrate, the flattening method comprising:

adjusting temperature of the mold by supplying gas to a spatial region between the mold and the mold holding unit in a state where the mold is sucked and held onto the mold holding unit;

bringing the mold into contact with the composition on the substrate; and irradiating the composition on the substrate with the light at least via the mold to cure the composition, the adjusting, the bringing, and the irradiating being performed in this order, wherein processing of irradiating the composition with the light to cure the composition in a state where the mold held on the mold holding unit is brought into contact with the composition on the substrate is executed with the mold separated from the mold holding unit.

13. The flattening method according to claim 12, wherein the flattening apparatus further includes a gas suction unit configured to suck the gas from the spatial region and a gas supply region configured to supply the gas to the spatial region, and wherein the adjusting is performed by controlling the gas suction unit and the gas supply unit.

14. The flattening method according to claim 12, wherein the mold holding unit of the flattening apparatus has a plurality of through holes, and wherein the adjusting includes sucking the gas from the spatial region via a part of the plurality of through holes and supplying the gas to the spatial region via another part of the plurality of through holes.

15. The flattening method according to claim 14, wherein the adjusting includes switching between using the plurality of through holes to suck the gas or using the plurality of through holes to supply the gas depending on the substrate subjected to flattening processing by the flattening apparatus.

16. The flattening method according to claim 12, wherein the bringing includes separating the mold from the mold holding unit.

17. An imprinting apparatus comprising:

a mold holding unit configured to suck and hold a mold having a patterned region;

a substrate holding unit configured to hold a substrate;

an exposure unit configured to irradiate a light curing composition supplied onto the substrate with light at least via the mold to cure the composition, the composition being irradiated with the light and cured in a state where the patterned region of the mold is in contact with the composition on the substrate;

a gas suction unit configured to suck gas from a spatial region between the mold and the mold holding unit;

a gas supply unit configured to supply the gas to the spatial region; and a control unit configured to control the gas suction unit and the gas supply unit to perform temperature adjustment processing for supplying the gas to the spatial region in a state where the mold is sucked and held onto the mold holding unit, wherein the control unit is configured to perform control such that processing of irradiating the composition with the light to cure the composition in a state where the mold held on the mold holding unit is brought into contact with the composition on the substrate is executed with the mold separated from the mold holding unit.

* * * * *